United States Patent [19]

VanZwienen

[11] Patent Number: 4,988,878
[45] Date of Patent: Jan. 29, 1991

[54] SUPPORT MEANS FOR A PARTICLE BEAM POSITION MONITOR

[75] Inventor: William H. VanZwienen, Bayshore, N.Y.

[73] Assignee: Associated Universities, Inc., Washington, D.C.

[21] Appl. No.: 489,546

[22] Filed: Mar. 7, 1990

[51] Int. Cl.$^5$ ............................................. G01K 5/00
[52] U.S. Cl. ................................. 250/397; 250/440.1; 250/442.1
[58] Field of Search ................... 250/397, 440.1, 442.1

[56] References Cited

U.S. PATENT DOCUMENTS

| | | | |
|---|---|---|---|
| 2,164,922 | 7/1939 | Hollmann | 315/3 |
| 2,619,609 | 11/1952 | Reid | 250/281 |
| 3,179,799 | 4/1965 | Valdre | 250/440.1 |
| 3,676,674 | 7/1972 | Zaviantseff | 250/363.01 |
| 3,887,811 | 6/1975 | Livesay | 250/442.1 |
| 4,390,784 | 6/1983 | Browning et al. | 250/287 |
| 4,749,276 | 6/1988 | Bragg et al. | 250/343 |
| 4,763,001 | 8/1988 | Poxleitner et al. | 250/334 |
| 4,773,752 | 9/1988 | Béchet et al. | 250/347 |

Primary Examiner—Janice A. Howell
Assistant Examiner—Drew A. Dunn
Attorney, Agent, or Firm—Margaret C. Bogosian; Vale P. Myles

[57] ABSTRACT

A support means for a plurality of thermally deformable component parts that are concentrically mounted within a thermally expandable housing. The support means includes a plurality of pins that are mounted in relatively fixed or sliding relationship to either one of the concentrically positioned components or to the housing, and the pins are positioned to extend through aligned apertures in the remaining components or the housing in a manner such that the pins are free to slide in a snug relationship relative to the sides of the holes through those components or the housing. The support means enables the concentrically mounted components and the housing to undergo expansion and contraction movement, radially and longitudinally relative to one another, while maintaining concentricity of the components and the housing relative to one another.

6 Claims, 3 Drawing Sheets

SUPPORT MEANS FOR A PARTICLE BEAM POSITION MONITOR

This invention was made with Government support under contract number DE-AC02-76CH00016, between the U.S. Department of Energy and Associated Universities, Inc. The Government has certain rights in the invention.

BACKGROUND OF THE INVENTION

The invention relates to a support mean for apparatus that is mounted in operating position within a housing relative to the center line of which the concentricity of the apparatus must not shift when thermal cycling of the housing and apparatus causes relative movement in a radial direction between those members and causes differential thermal expansion between those members in a longitudinal direction. More particularly, a preferred application of the invention relates to a particle beam position monitoring apparatus that is mounted concentrically within a calibration ring and is provided with a support means that permits relative radial movement and relative thermal growth or contraction in a longitudinal direction between the monitoring apparatus, the calibration ring and the housing, while maintaining a required degree of close concentricity between the components themselves and the housing.

In the design of particle beam position monitoring apparatus it has long been recognized that the accuracy and reliability of beam position signals produced by the monitors is subject to random positional variations of components caused by thermal cycling of the apparatus. Such thermal cycling inevitably occurs because the position monitoring components in some instances must be vacuum fired at about 950° C. and subsequently they are periodically baked to approximately 300° C. in order to achieve ultra high vacuum conditions. A common type of beam position monitor is configured as a split-plate or split-cylinder mounted adjacent to a particle beam in a manner such that the split-plates generate electrical signals due to capacitive coupling of each plate to the charged particle beam. Because the plates of such position monitoring apparatus are split diagonally relative to the longitudinal center line of the surrounded beam, the resultant signal on each plate is proportional to the position of the beam with respect to the center line of the plates. Accordingly, it is important to prevent a change in concentricity of the split plates with respect to one another as well as with respect to the adjacent cylindrical components, while enabling the plates to move radially and to thermally expand in a longitudinal direction relative to the beam line when the apparatus is subjected to thermal cycling.

Another design problem concerning such split-plate beam position monitors and their associated support means is that the beam position signals detected by the plate must be brought out through the housing of the particle beam line without compromising either the ultra high vacuum requirements or the concentricity-maintaining function of the support for the position monitor detector plates and the associated calibration apparatus mounted within the beam line housing.

OBJECTS OF THE INVENTION

A major object of the invention is to provide a support means for a particle beam position monitor such that the support means allows relative radial movement between the position monitor components and the beam housing, and permits differential thermal expansion and contraction between those comments and the housing in a longitudinal direction, while the required close concentricity between those components and the housing is preserved.

Another object of the invention is to provide a split-plate or split-cylinder beam position monitoring apparatus mounted concentrically within a calibrating ring and within a tubular beam housing, with ceramic pins positioned between the monitor, the calibrating ring and the housing in a manner that permits relative radial movement between the components and the housing and permits relative thermal expansion between those members in a longitudinal direction, while maintaining the required close concentricity between the components and the housing.

A further object of the invention is to provide a beam position monitor support means that can be thermally cycled repeatedly between room temperature and about 300° C. without causing thermal stress or permitting a relative change in concentricity between the housing of an associated beam line and components of a beam position monitor apparatus that is mounted concentrically within the housing.

Additional objects and advantages of the invention will become apparent to those skilled in the art from the description presented herein, taken in connection with the accompanying drawings.

SUMMARY OF THE INVENTION

In a preferred embodiment of the invention a particle beam position monitor support means is formed by mounting a first plurality of dielectric pins in sliding relationship respectively with apertures through a beam line housing, positioning a calibration ring concentrically within the housing, and positioning a split-cylinder beam position monitor apparatus concentrically within the calibration ring. A plurality of holes are provided in the calibration ring. A second plurality of dielectric pins are mounted at spaced positions on the respective halves of the beam position monitoring apparatus so that each of those pins extend in snug sliding relationship through a respective one of the holes in the calibration ring. The first plurality of pins mounted in sliding relationship through apertures in the beam line housing are arranged so that their inner ends extend in snug sliding relationship through respective selected holes in the calibration ring. When the split-cylinder position monitor apparatus is subjected to thermal cycling, it is permitted to expand and contract radially and longitudinally relative to the calibration ring and the housing, while the afore-mentioned first and second plurality of pins maintain a required degree of close concentricity between the apparatus components themselves and the housing.

DESCRIPTION OF THE PREFERRED EMBODIMENT

Figure 1:
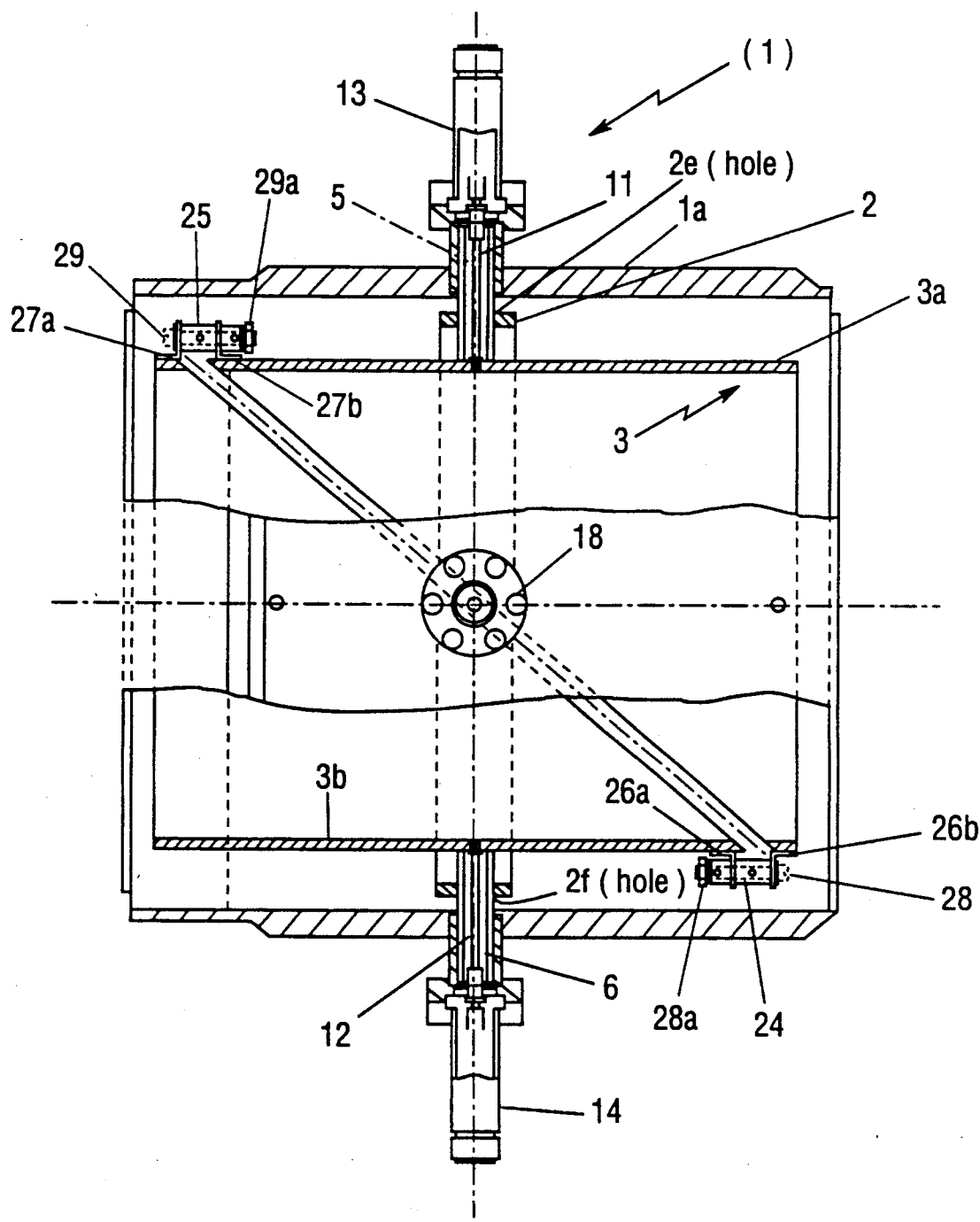
FIG. 1 is a side view, in cross section along a central vertical plane, of a portion of a tubular housing for a particle-beam-confining apparatus in which a calibration ring and a split-cylinder beam position monitor apparatus are concentrically mounted with a support means according to the teaching of the present invention.
Figure 2:
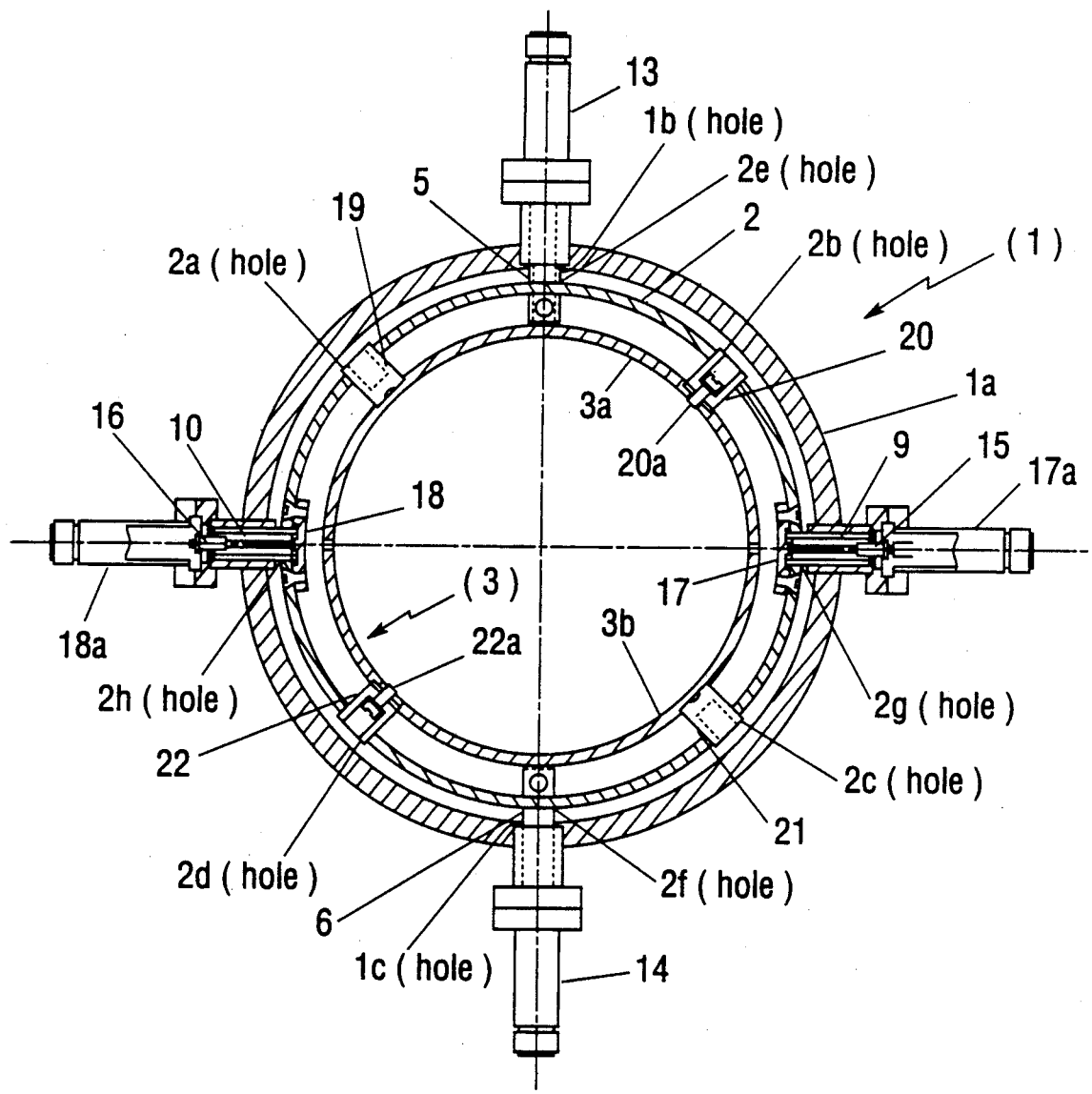
FIG. 2 is an end view, from the right side of the apparatus shown in FIG. 1, showing the apparatus partly in cross section along its central vertical plane.

There is shown in FIGS. 1 and 2 of the drawing a preferred embodiment of a particle beam position monitor apparatus that is provided with support means according to the teaching of the present invention. As the description of the invention proceeds, it will be apparent to those skilled in the art that the support means of the present invention can be applied in various alternative forms, or in modified apparatus in which there exists a need to accommodate relative radial and longitudinal thermal expansion or contraction of concentrically mounted components, while maintaining a required degree of close concentricity between such components.

As used herein, the phrase relative longitudinal and radial movements refer, respectively, to movements in a direction parallel to and transverse to the horizontal longitudinal axis of the housing shown in FIGS. 1 and 2. The overall apparatus 1, as it is illustrated in FIGS. 1 and 2, comprises a tubular metal housing 1a within which there is concentrically positioned a metal calibration ring 2, which has a plurality of holes 2a, 2b, 2c and 2d of a predetermined diameter formed through it at spaced points on the circumference of the ring, as is best seen in FIG. 2. Preferably the holes 2a–2d are equally spaced around the circumference of ring 2. Also, a split-cylinder particle beam position detector 3, comprising generally symmetrical halves 3a and 3b, is positioned concentrically within the calibration ring 2 and the housing 1a. Dielectric pins 5 and 6, formed of a suitable dielectric material such as pressed ceramic powder that is shaped into hollow tubes in this embodiment, are mounted in predetermined positions relative to the respectives halves 3a and 3b of the detector. The diameters of the pins 5 and 6 are made to fit snuggly in sliding relationship through holes 2e and 2f formed at spaced points through the calibration ring 2, as shown in FIGS. 1 and 2. A second similar pair of holes 2g and 2h through the calibration ring 2 have inserted through them, respectively, hollow ceramic pins 9 and 10. In the preferred embodiment, the pins 5 and 6 are mounted in snug sliding relationship through apertures 1b and 1c that are formed through the housing 1a. The inner ends of pins 5 and 6 abut, but are not fastened to, the respective halves 3a and 3b of the detector.

In order to connect associated electrical circuitry to the respective halves 3a and 3b of the detector, there are provided electrical conductors 11 and 12, which are connected by suitable conventional mechanical means (such as a threaded fit), respectively, through (or into) the top half 3a and the bottom half 3b of the split-cylinder detector. Any suitable commercially available co-axial cable and connector means, such as that illustrated generally by the connector means 13 and 14, can be used to complete the desired electrical circuit hook-up to the respective halves 3a and 3b, of the detector to place it in condition for operation. A somewhat analogous electrical connection arrangement is provided for connecting associated instrumentation (not shown) to the calibration ring 2. Thus, as is shown in FIG. 2, there is inserted through the holes 2g and 2h in the calibration ring, the respective ends of a pair of ceramic hollow tubular pins 9 and 10, through which a pair of electrical conductors 15 and 16 extend into respective conducting relationship with fittings 17 and 18. The fittings 17 and 18 are secured by screws, as shown, or by any other suitable conventional means, to the calibration ring 2. The outer ends of the conductors 15 and 16 are electrically connected, respectively, to suitable commercially available co-axial cable and associated connector means 17a and 18a by a suitable connecting means.

In addition to the plurality of dielectric, ceramic pins 5, 6, 9 and 10 which are mounted with one of their respective ends in snug sliding relationship with the apertures through housing 1a, and with their respective other ends extending through one of the holes 2e, 2f, 2g or 2h in the calibration ring 2, the support means of the present invention comprises a second plurality of dielectric, pressed ceramic powder pins 19, 20, 21 and 22. Each pin of this second plurality of pins has its respective inner end mounted in fixed position relative to the halves 3a and 3b of the split-cylinder detector on which they are mounted, as best seen in FIG. 2. In this embodiment of the invention, screws, such as the screws 20a and 22a shown in FIG. 2, relative to the pins 20 and 22, are used to secure the pins 19–22 in mounted fixed relationship to the respective halves of the split cylinder detector. Of course, in alternative embodiments of the invention other conventional mounting means can be used to secure such pins in desired fixed operating positions relative to the split-cylinder detector.

The diameter of each of the ceramic pins, in both the first plurality of pins 5, 6, 9 and 10 and the second plurality of pins 19–22, is made such that all of those pins is within a predetermined clearance tolerance of the diameter of the related holes through which the pins extend in the calibration ring 2. That clearance tolerance is determined such that the calibration ring 2 and the split-cylinder detector 3 and the housing 1a can expand and contract relative to one another in both a radial and longitudinal direction, while maintaining close concentricity relative to one another due to the restraining force of the ceramic pins. In the preferred embodiment of the invention, the predetermined clearance tolerance between the respective pins and their associated holes through the calibration ring 2 is made to be within the range of 1 to 5 mils. Also, in this embodiment of the invention the pressed ceramic dielectric material that is used to form the respective pins is powdered aluminum oxide, $Al_2O_3$, but it will be understood that in alternative embodiments of the invention other suitable dielectric materials may be used to form such pins for the support means of the invention.

In the illustrated preferred embodiment of the invention, the halves 3a and 3b of the detector are shown in FIG. 1 to be secured in space relationship to each other by a pair of stepped ceramic spacer pins 24 and 25, associated metal brackets 26a, 26b, and 27a, 27b, and threaded bolts 28 and 29, and associated threaded nuts 28a and 29a as shown generally in FIG. 1. Of course, other suitable conventional means may be used to mount such detector segments in spaced relationship, as is well known in the art. Also, it will be appreciated that various conventional forms of split-plate detectors can be used in practicing other embodiments of the invention. Similarly, other conventional structural details for a suitable housing 1a and calibration ring 2 are not explained or illustrated in further detail herein, because such features are generally well known and do not form a critical part of the subject invention.

Figure 3:
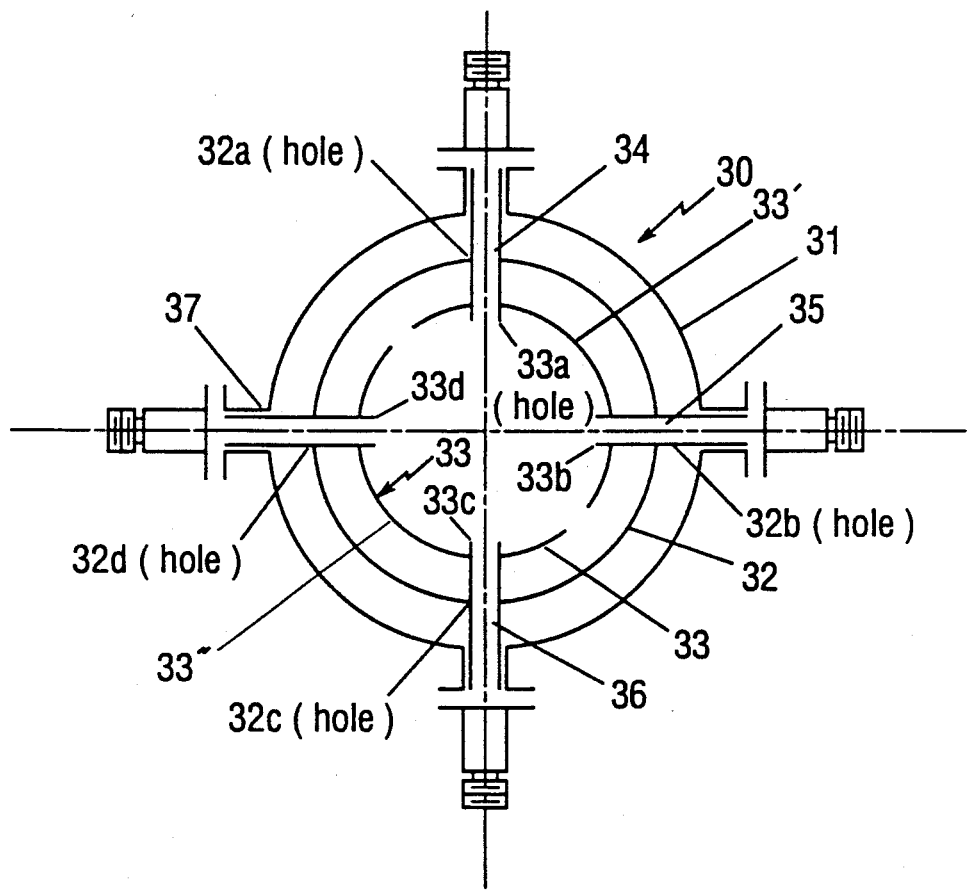
FIG. 3 is a schematic diagram in plan view, similar in perspective to the end view of the somewhat related apparatus shown in FIG. 2, of an alternative embodiment of the invention wherein a support means constructed in accordance with the present invention is formed of a single plurality of dielectric pins that are mounted in predetermined positions relative to a beam line housing and have their inner ends positioned to extend, respectively, in snug sliding relationship through aligned apertures in both a split-cylinder beam position monitor apparatus and a calibration ring.

From the foregoing description of the invention, it should be apparent that various alternative forms of it may be developed without departing from the scope of the invention. For example, there is schematically illustrated in FIG. 3 one such alternative form of a particle beam apparatus 30 which includes a plurality of concentrically mounted components each of which are subjected to thermal cycling during the manufacturer or operation of the apparatus. Specifically, the apparatus 30 includes a generally cylindrical housing 31 within which there is concentrically position an expandable member such as a calibration ring 32 and a split-cylinder detector 33, which may be in generally the same form as the detector shown in FIGS. 1 and 2. Thus, the detector 33 comprises symmetrical halves 33' and 33". A plurality of dielectric hollow pins 34, 35, 36 and 37 are mounted in sliding relationship with holes in the housing 31, so the pins 34-37 are prevented from moving in a longitudinal direction with respect to the housing 31. Any suitable conventional pin-mounting means can be used, or mounting arrangements such as those shown for the pins 9 and 10 in the embodiment of the invention illustrated in FIG. 2 can be used. Each of the pins 34-37 extends through suitable respective apertures 32a, 32b, 32c and 32d that are formed through the calibration ring 32, and through aligned apertures 33a-33d that are formed through the respective halves 33' and 33" of the split-plate detector 33. With this embodiment of the invention, when the apparatus 30 is thermally cycled, the housing 31, the calibration ring 32 and the halves of the detector 33 can expand and contract radially and longitudinally with respect to one another while maintaining a required degree of close concentricity between themselves, due to their respective interaction with the dielectric pins 34-37 and their snug sliding relationship with those pins. It will be understood that the snug sliding relationship is preferably made within the 1 to 5 mil clearance tolerance used for the embodiment described with reference to FIGS. 1 and 2.

It should be further apparent that the advantages of the invention can be realized by making other modifications or alternative embodiments wherein a selected plurality of pins are mounted in fix relationship to one of a number of concentrically mounted operating or housing components, while other portions of those pins are positioned in snug sliding relationship through aligned apertures in one or more additional concentrically mounted components of the apparatus or housing, thereby to permit both radial and longitudinal expansion and contraction of the concentrically mounted components relative to one another while maintaining concentricity of the components of the apparatus relative to one another.

Such additional modifications and alternative forms of the invention will become apparent to those skilled in the art from the description of it presented herein; accordingly, it is my intention to encompass within the following claims the true spirit and scope of the invention.

What is claimed is:

1. A particle beam apparatus having support means that permit relative radial and longitudinal expansion and contraction between the apparatus housing and selected concentrically positioned components of the apparatus while maintaining concentricity between those components relative to one another, comprising;
   a. a tubular housing,
   b. a calibration ring having a plurality of holes of predetermined diameter formed through the ring at spaced points on its circumference, said ring being positioned concentrically within the tubular housing,
   c. a split-cylinder detector comprising two generally symmetrical halves, said detector being positioned concentrically within said calibration ring and the housing,
   d. a support means comprising a first plurality of dielectric pins, one of the ends of each of said pins being secured against movement in a longitudinal direction with respect to the longitudinal axis of the housing, the respective other ends of each of the pins being positioned to extend through a respective hole in said calibration ring, and a second plurality of pins mounted with one of the ends of each pin in said second plurality mounted in fixed position relative to one half of the split-cylinder detector, the respective other ends of each of the pins in the second plurality being positioned to extend through a respective hole in said calibration ring, the diameter of each of said holes through the ring being formed with a predetermined clearance tolerance between the diameter of the hole and a pin extending through it, thereby to provide a snug sliding relationship between each pin and the respective hole in the calibration ring, whereby the calibration ring, the split-cylinder detector and the housing are enabled to expand and contract relative to one another in a radial and longitudinal direction, while their close concentricity relative to one another is maintained.

2. An invention as defined in claim 1 wherein each of said pins is formed of a dielectric material.

3. An invention as defined in claim 2 wherein said dielectric material is pressed-powdered $Al_2O_3$.

4. An invention as defined in claim 1 wherein the longitudinal axis of all of said pins are disposed in a common plane.

5. An invention as defined in claim 1 wherein the spaced points on the circumference of the calibration where said holes are formed are equally spaced points.

6. A particle beam apparatus having a beam position monitor apparatus support means that permits relative radial and longitudinal thermal expansive movement between selected concentrically positioned components of the beam apparatus while maintaining the concentricity between those components relative to one another, comprising,
   a. a generally cylindrical housing,
   b. an annular thermally expandable member positioned concentrically within the housing,
   c. a split-plate detector comprising generally symmetrical halves that are positioned concentrically within said housing and within said annular member,
   d. and a support means comprising a plurality of dielectric pins each of which has one of its ends secured in sliding relationship against longitudinal movement parallel to the longitudinal axis of said housing, and each of which further extends through aligned apertures in both the annular member and the split plate detector such that the pins form a snug sliding relationship with the sides of said apertures, whereby the housing, the annular member and the split plate detector are permitted to expand and contract radially and longitudinally with respect to one another when the beam apparatus is thermally cycled, while maintaining a predetermined degree of concentricity between them due to their respective interaction with the dielectric pins.

* * * * *